US007471168B2

(12) United States Patent
Lee et al.

(10) Patent No.: US 7,471,168 B2
(45) Date of Patent: Dec. 30, 2008

(54) SMA CONNECTOR

(75) Inventors: Jong-Chul Lee, Euijungbu (KR); Jae-Sun Lee, Seoul (KR); Ki-Byoung Kim, Chunahn (KR); Tae-Soon Yun, Seoul (KR); Sang-Gun Lee, Seoul (KR); Nam-Young Kim, Soul (KR); Jong-Heon Kim, Seoul (KR); Byung-Je Lee, Seoul (KR); Bub-Sang Yun, Seoul (KR); Kuk-Hwan Ra, Seoul (KR); Youn-Joo Lee, Incheon (KR); Sun-Won Hong, Seoul (KR)

(73) Assignees: Mission Technology Co., Ltd. (KR); Kwangwoon University Industry-Academic Collaboration Foundation (KR)

( * ) Notice: Subject to any disclaimer, the term of this patent is extended or adjusted under 35 U.S.C. 154(b) by 358 days.

(21) Appl. No.: 10/522,561

(22) PCT Filed: Jul. 14, 2003

(86) PCT No.: PCT/KR03/01395

§ 371 (c)(1), (2), (4) Date: Jan. 27, 2006

(87) PCT Pub. No.: WO2004/008583

PCT Pub. Date: Jan. 22, 2004

(65) Prior Publication Data

US 2006/0128215 A1 Jun. 15, 2006

(30) Foreign Application Priority Data

| | | |
|---|---|---|
| Jul. 15, 2002 | (KR) | 10-2002-0041260 |
| Jul. 15, 2002 | (KR) | 10-2002-0041286 |
| Feb. 3, 2003 | (KR) | 10-2003-0006579 |

(51) Int. Cl.
*H03H 7/38* (2006.01)

(52) U.S. Cl. ............................ 333/34; 439/63; 439/578

(58) Field of Classification Search .................. 333/33, 333/34; 439/63, 578

See application file for complete search history.

(56) References Cited

U.S. PATENT DOCUMENTS 5,577,269 A * 11/1996 Ludewig .................. 455/575.7

* cited by examiner

*Primary Examiner*—Stephen E Jones
(74) *Attorney, Agent, or Firm*—The Farrell Law Firm, PC

(57) ABSTRACT

The present invention discloses to an SMA connector, a preferable embodiment of which comprises a body acting as ground, a central conductor existing in the inner part of the ground, an insulator with a predetermined dielectric constant existing between the body and the central conductor, a first step transition part formed in the body, a taper formed in the central conductor in order to improve RF characteristics and to fix the central conductor and the insulator, and a second step transition part formed in the central conductor corresponding to the first step transition part to improve RF characteristics.

26 Claims, 7 Drawing Sheets

SMA CONNECTOR

FIELD OF THE INVENTION

This invention relates to a microwave SMA (superplastic metal alloy) connector.

PRIOR ART OF THE INVENTION

Recently, owing to the development of communication technology and expansion of communication market, the common frequency bandwidth is using high frequencies more and more. For example, wireless LAN is used at 5.8 GHz and LMDS (Local Multipoint Distribution Service) is used at 24~25 GHz of K-band, where LMDS is a technique for replacing the existing cable CATV by wireless CATV. In addition, X-band (8~12.5 GHz) and Ku-band (12.5~18 GHz), which are used to satellite communication, are appearing nowadays. Accordingly the countries centering on USA, Japan, Europe put spurs to the development of goods that used in high frequency bandwidth. Like this, the development of RF connector becomes important gradually according to the fact that the common frequency bandwidth is becoming higher. While in the existing RF connector production is convenient and production cost is inexpensive because the existing RF connector uses a bar type outer conductor and a bar type dielectric substance, it makes holes be formed at the outer conductor by using the bar captured contact method and disturbs the outer conductor's discontinuity to induce RF loss. And also a fastening method according to the epoxy insertion among the methods used in a microwave connector is used and it is a method, which makes holes at the side of a connector to insert epoxy and the conductor's thickness should be different for impedance junction and the manufacturing process is becoming complicated more and more and induces the production cost's increase as well as many difficulties in designing microwave SMA connector. Accordingly the necessity to solve such problems and to develop an SMA connector usable in higher bandwidth at the same time is increasing gradually.

Figure 1:
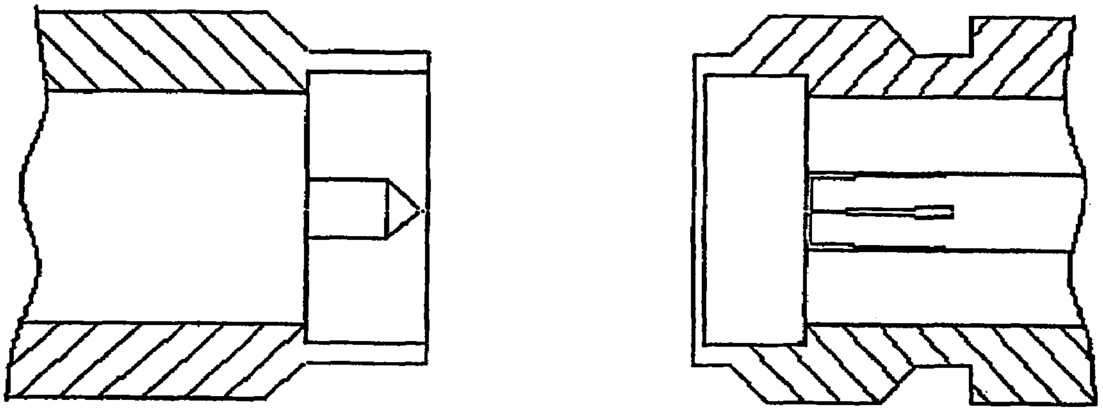
Figure 2:
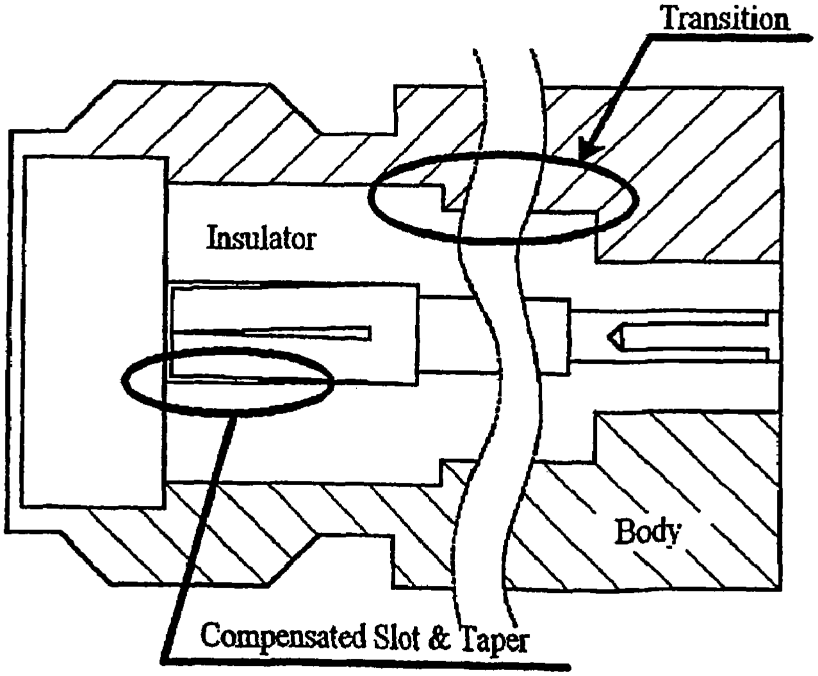

FIG. 1 shows a male part and a female part of a low frequency JACK type existing RF connector. In this figure, (a) denotes a male part and (b) denotes a female part. There are many differences with a microwave connector in structure. FIG. 2 shows a cross section view of the existing microwave connector.

TECHNICAL SUBJECTS OF THE INVENTION TO BE SOLVED

The present invention was invented to solve the above problems of the prior arts and has an object to provide a microwave SMA connector that has an outer conductor having step structure to get the same characteristics at high frequency as at low frequency and makes a PTFE dielectric substance coincide with the outer connector for impedance matching.

Another object of the present invention is to provide a technology to simplify the manufacturing process and improve RF performance by using a fastening method using taper to reduce the RF loss according to the discontinuity of the outer conductor because the invention is more sensitive to the discontinuous part when the frequency becomes higher.

It is other object of the present invention to provide a microwave SMA connector with broad bandwidth characteristics using multiple step structure in order that dielectric substance coincides with the outer connector for impedance matching according to the connector outer conductor having step structure to get the excellent response characteristics at high frequency.

It is other object of the present invention to provide a microwave SMA connector with broad bandwidth characteristics using step and slot structure in order that dielectric substance coincides with the outer connector for impedance matching according to the technology using the connector outer conductor having step and slot structure provided to get the excellent response characteristics at high frequency.

It is other object of the present invention to provide a microwave SMA connector, wherein a slit is inserted into an outer conductor in order that PTFE dielectric substance coincides with the outer connector for impedance matching according to the technology using the connector outer conductor having step structure to get the same response characteristics as at low frequency.

It is other object of the present invention to provide a technique to simplify the manufacturing process and to improve RF characteristics by a fastening method using the inserted slit for reduction of RF loss caused by the discontinuity at the outer conductor.

It is other object of the present invention to provide a microwave SMA connector in order that PTFE dielectric substance coincides with the outer connector for impedance matching according to the technology operating at the higher frequency by using the connector outer conductor having step structure and by improving the dielectric loss by inserting air layer through the separation of the dielectric substance to get the same characteristics as at low frequency.

It is other object of the present invention to provide a technique to simplify the manufacturing process and improve RF characteristics by a fastening method using the central conductor's diameter change according to the impedance matching between dielectric substance and air layer.

Other objects and benefits of this present invention will become apparent by reading the detailed description of this invention and making reference to the attached drawings.

SIMPLE EXPLANATION OF DRAWINGS OF THE PRESENT INVENTION

Figure 3:
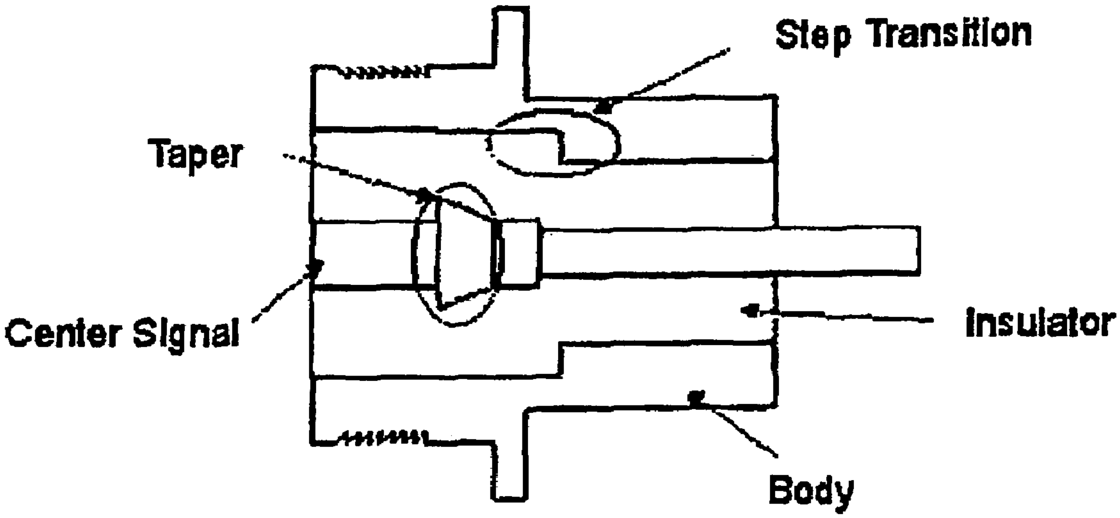
Figure 4:
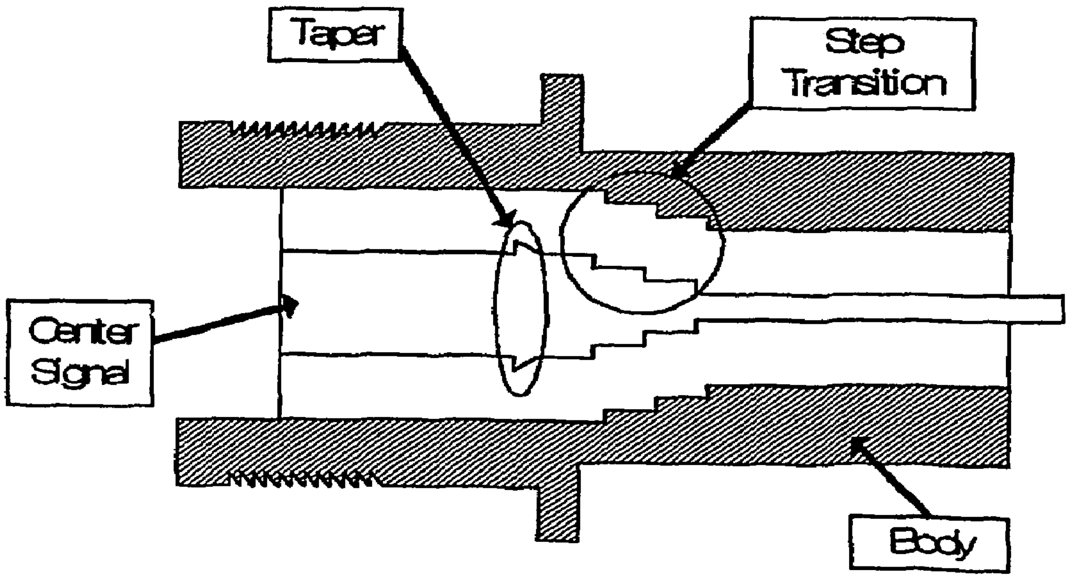
Figure 5:
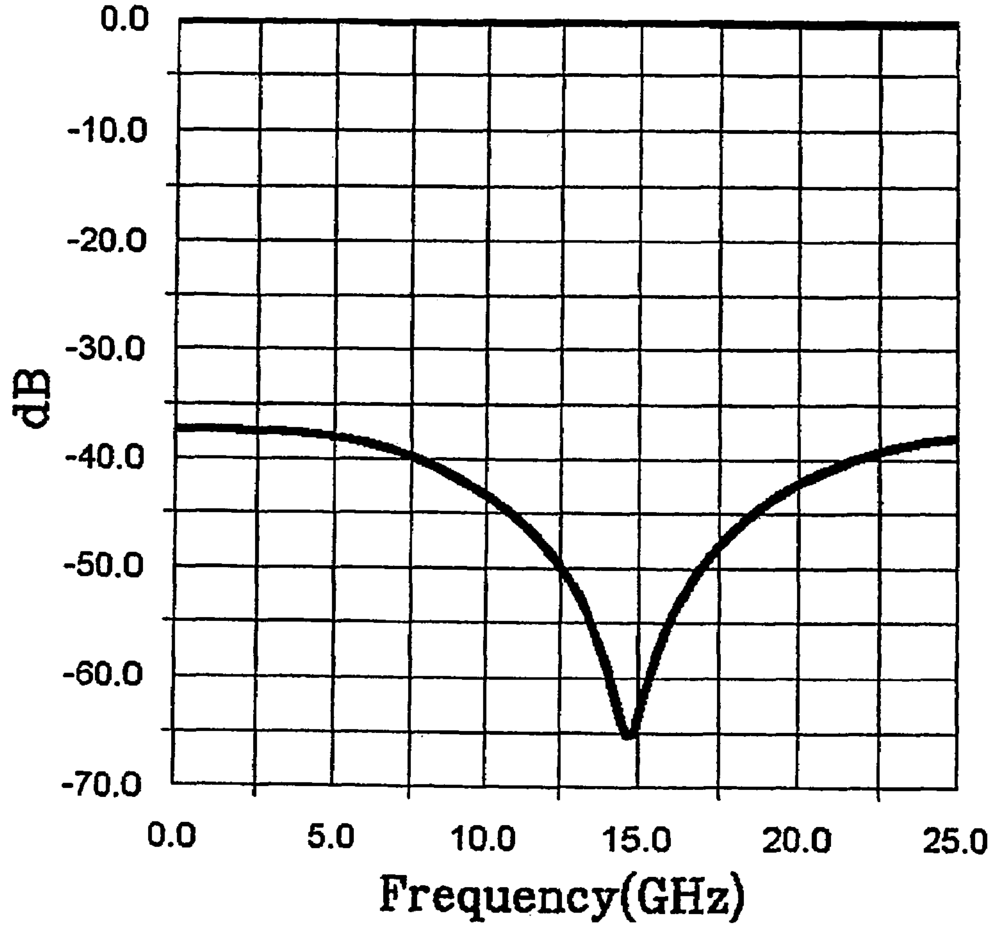
Figure 6:
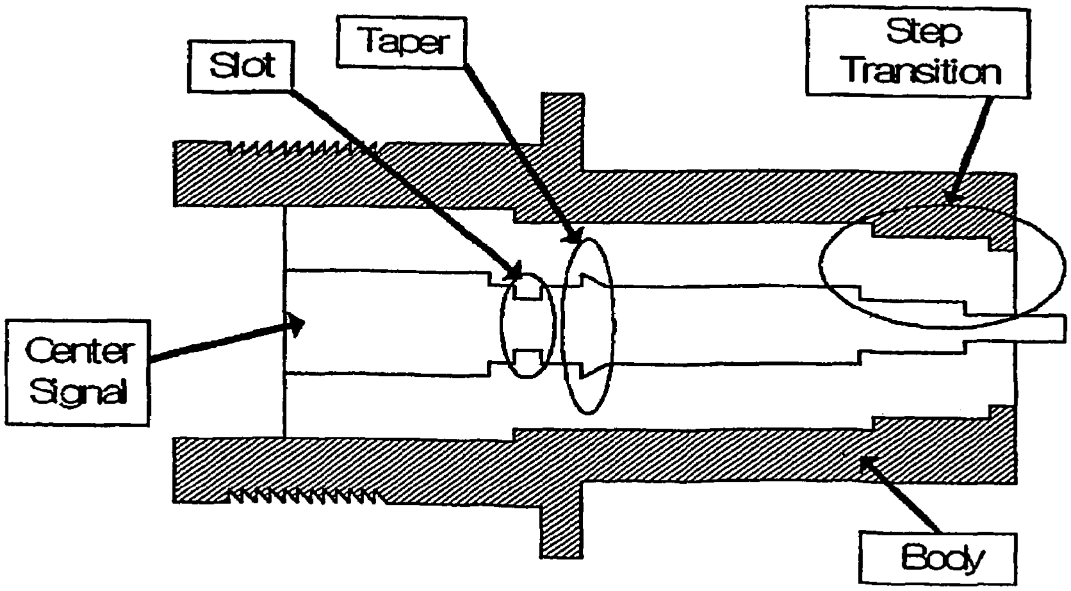
Figure 7:
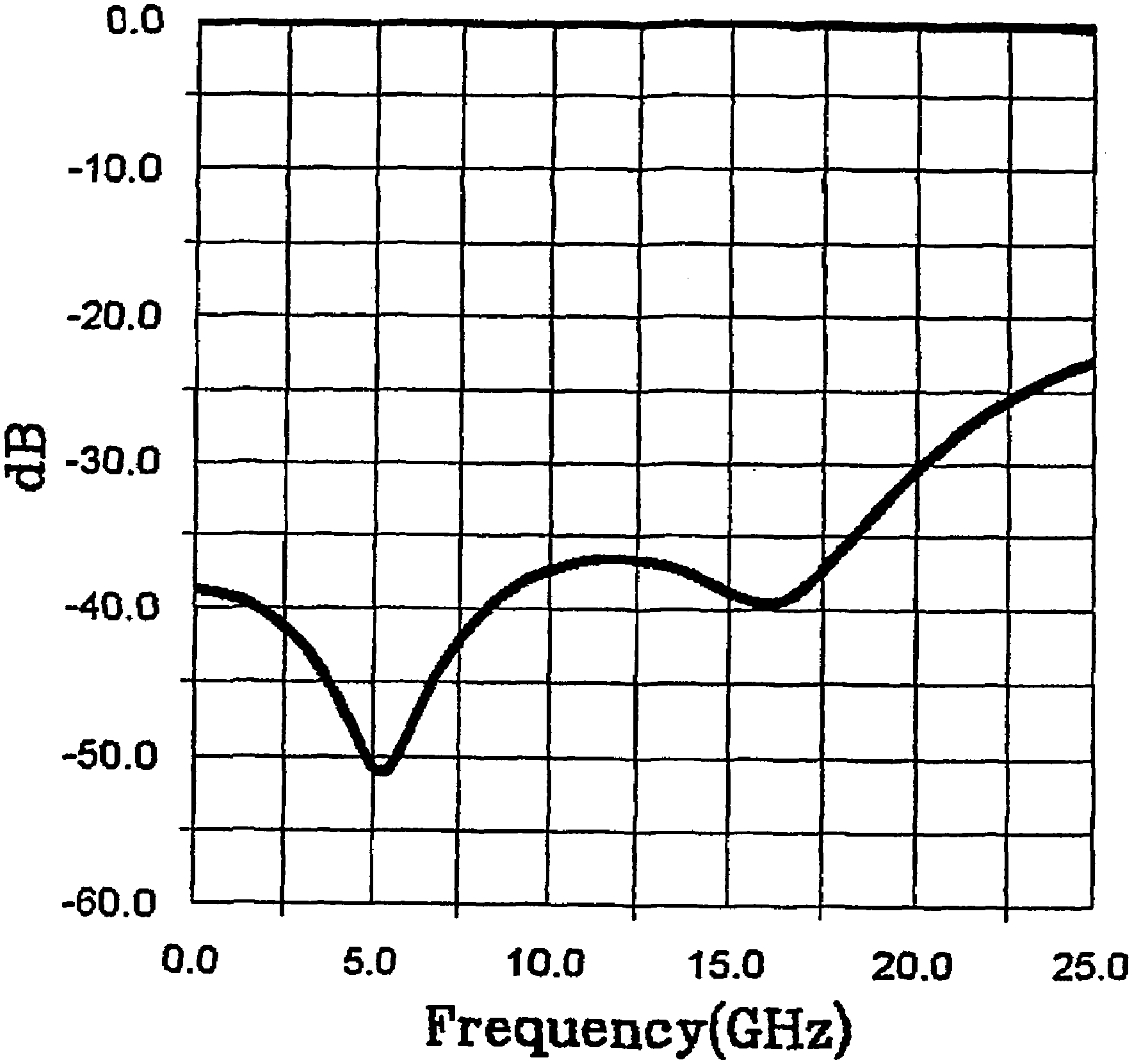
Figure 8:
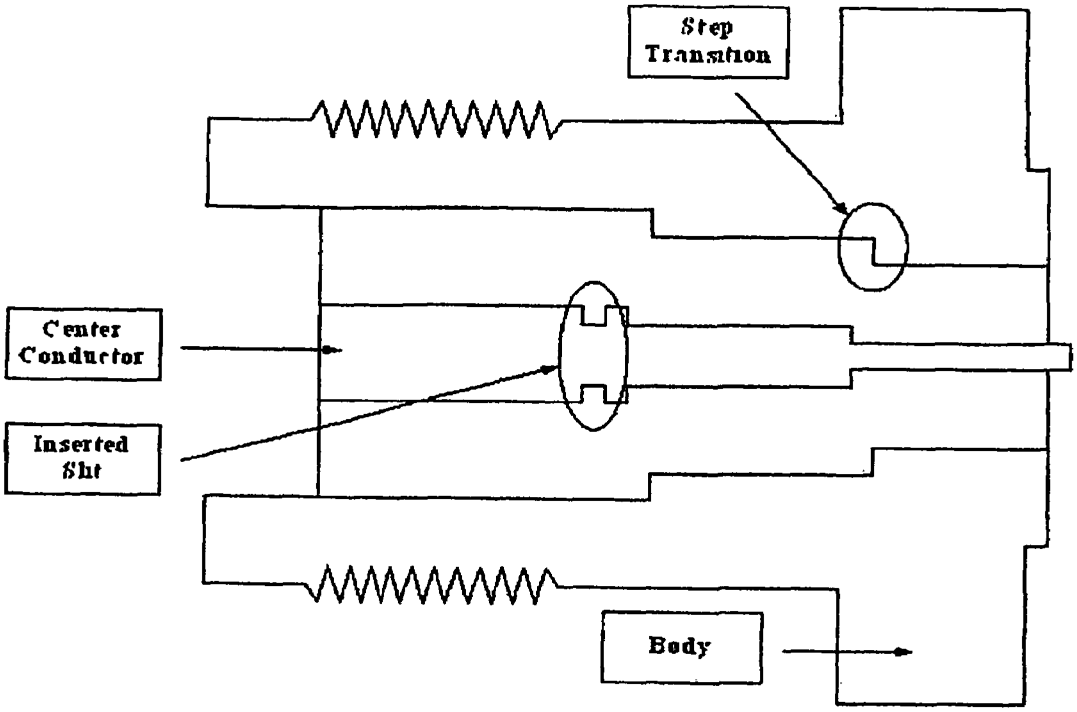
Figure 9:
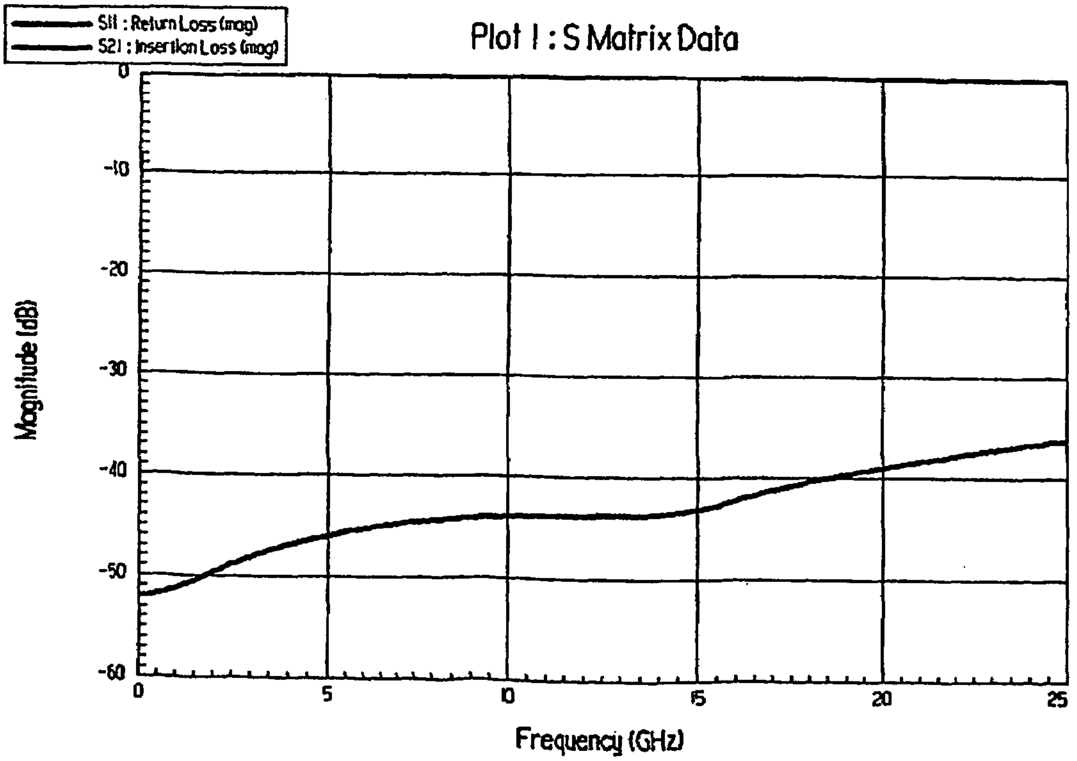
Figure 10:
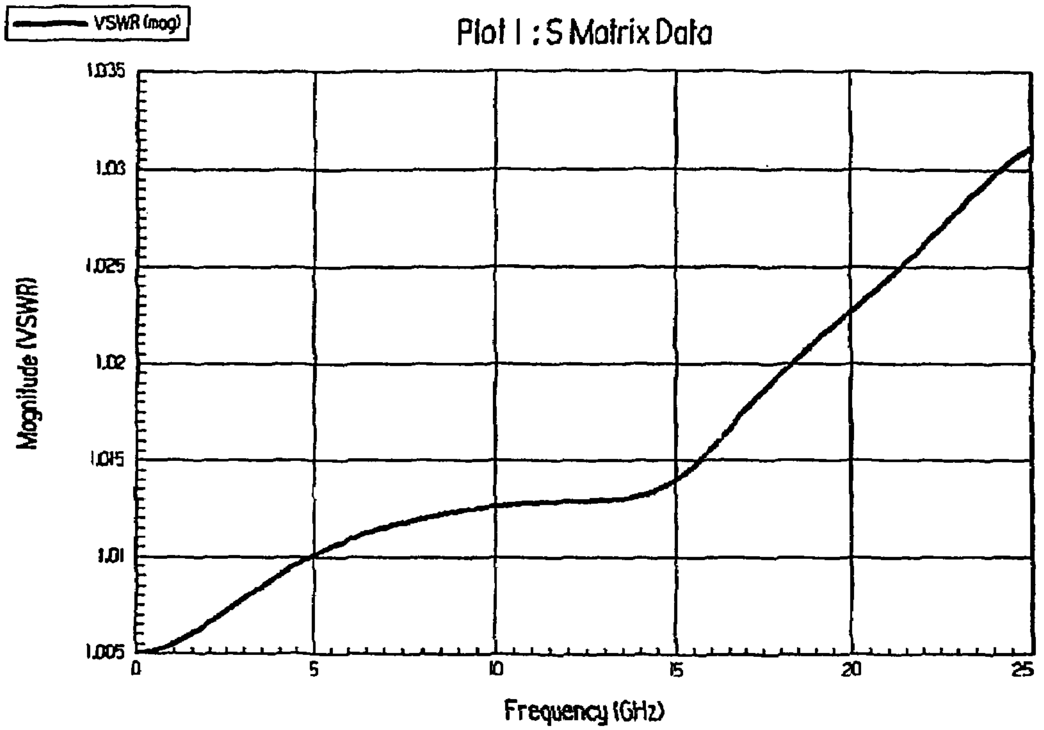
Figure 11:
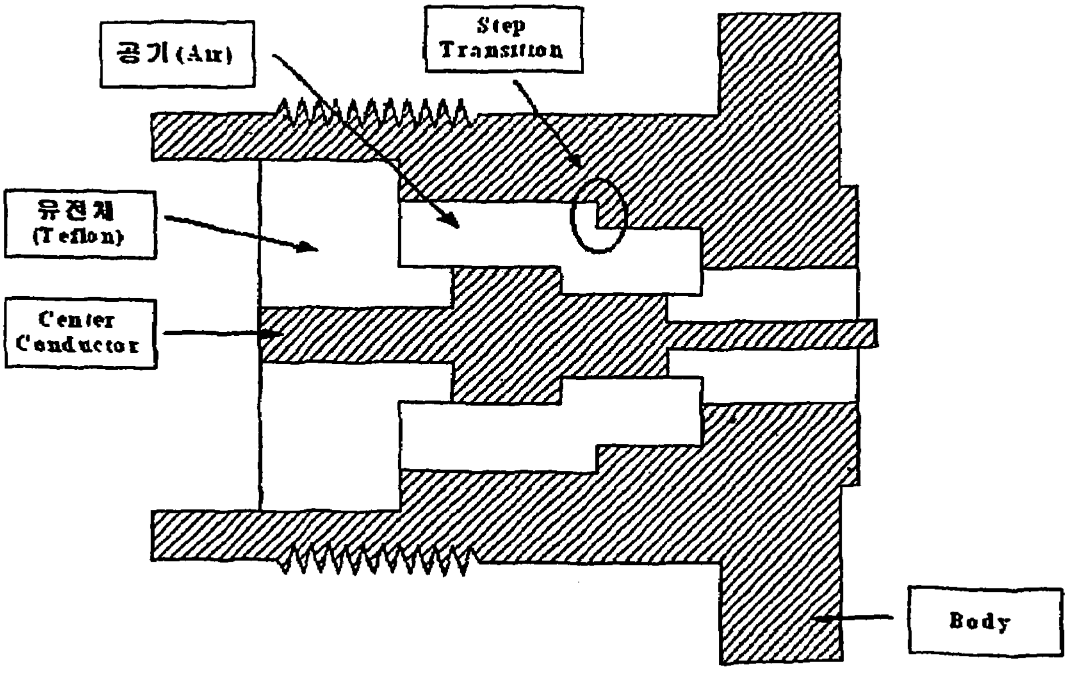
Figure 12:
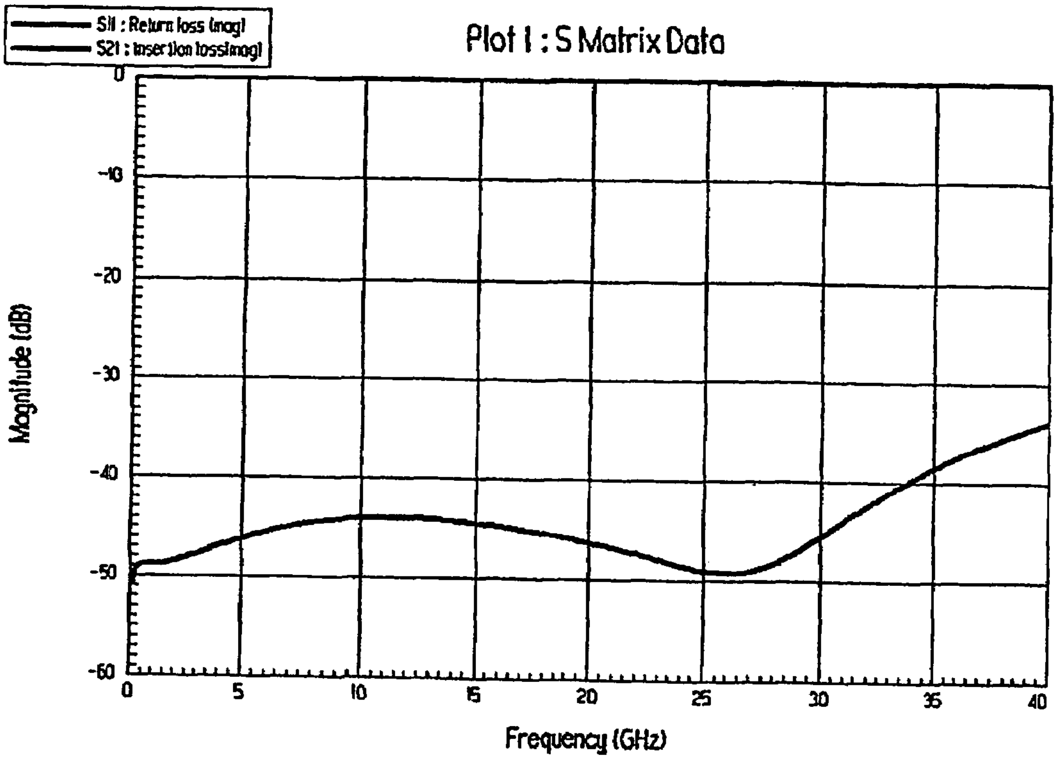
Figure 13:
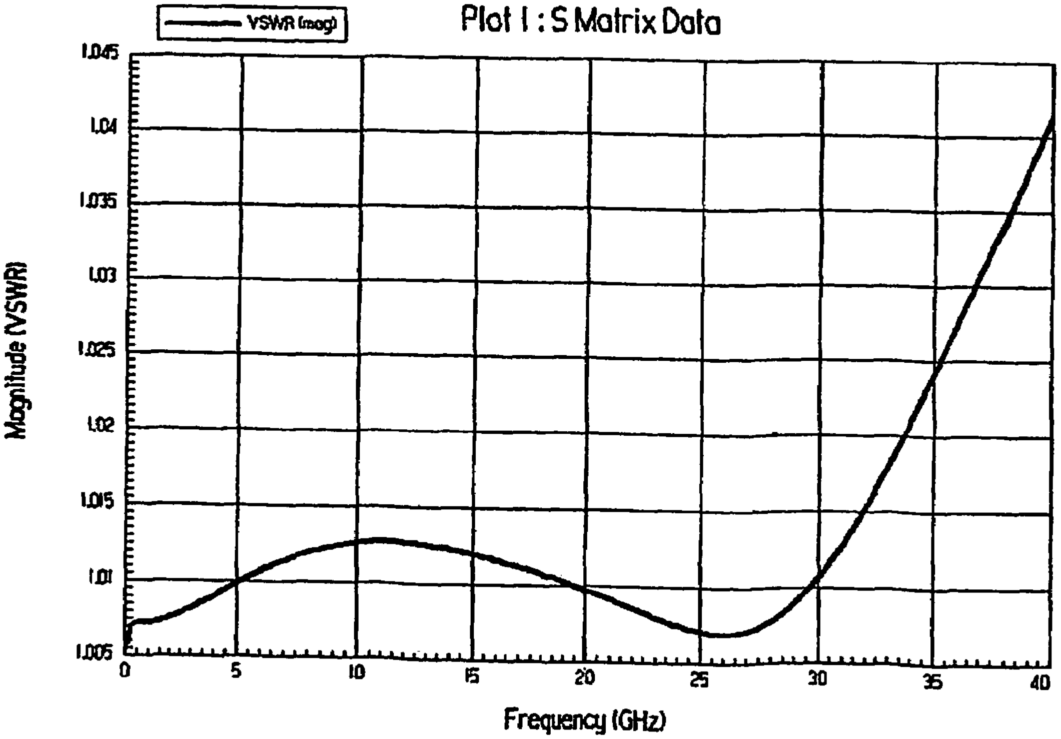

FIG. 1 illustrates a cross section of the existing general low frequency JACK type connector, FIG. 2 illustrates a cross section of the existing general microwave connector, FIG. 3 illustrates a preferred embodiment of a microwave SMA connector according to the present invention, FIG. 4 illustrates a preferred embodiment of a microwave SMA connector using step structure on its central conductor according to the present invention, FIG. 5 is a graph showing inserted loss and reflected loss of the connector of FIG. 4, FIG. 6 illustrates a preferred embodiment of a microwave SMA connector using slot and step structure at its central conductor according to the present invention, FIG. 7 is a graph showing inserted loss and reflected loss of the connector of FIG. 6, FIG. 8 illustrates a preferred embodiment of an SMA connector in conductor of which slit is inserted according to the present invention, FIG. 9 is a graph showing inserted loss and reflected loss of the connector of FIG. 8, FIG. 10 illustrates a SWR (standing wave ratio) graph of the connector of FIG. 8, FIG. 11 illustrates a preferred embodiment of an SMA connector, in which air is inserted according to the present invention, FIG. 12 is a graph showing inserted loss and reflected loss of the connector of FIG. 11, FIG. 13 illustrates a SWR (standing wave ratio) graph of the connector of FIG. 11.

DETAILED DESCRIPTION OF THE PRESENT INVENTION

<A First Preferred Embodiment: A Microwave SMA Connector>

Hereinafter we explain about a microwave SMA connector having improved RF characteristics according to the present invention with reference to FIG. 3, which shows a preferred embodiment of the present invention.

In accordance with the present invention, the characteristic impedance of a microwave SMA connector having improved RF characteristics is obtained by the ratio of the thickness of central conductor i.e. by the ratio of central signal line to the thickness of insulator.

Therefore it is preferable that characteristic impedance of the connector is designed to be 50Ω. It is preferable that the insulator is Teflon and the body and the central conductor are gilded with gold in order to optimize the RF characteristics of the conductor. The body of the connector designed according to the invention plays a role as ground from the RF characteristics point of view.

In addition, taper fixes dielectric substance i.e. insulator to central conductor and its length has to satisfy the relation of $$l \leq \frac{\lambda_g}{4} \qquad \text{(Equation 1)}$$

where l is length of the taper, and

λg is wavelength of the highest one of frequencies of that can pass the connector.

In FIG. 3, the step transition part is used in order to improve RF characteristics and in this embodiment, the characteristic impedance is designed to be 50Ω and the distance between step transition part of the body and the step transition part of the central conductor has to satisfy the relation of $$h \leq \frac{\lambda_g}{10} \qquad \text{(Equation 2)}$$

where h is the distance between step transition part of the body and step transition part of the central conductor.

In FIG. 3, the step transition part of the central conductor is the step shape part that begins from the right edge of a taper and is formed by cross section of central conductor. In this embodiment, it is characterized in that cross-section of the taper has ladder form. And also it is characterized in that the step transition part has a unit step structure. There is a conductor at the inner part of the connector according to this invention and insulator surrounds the conductor's circumference and there is a body at the most outer part of it. The step transition parts are formed at the part where the inner part of the body and the central conductor are connected to the taper. A center signal part is connected to the left of the taper.

In this embodiment, it is preferable that the SMA connector is designed so that its characteristic impedance, the inserted loss and the VSWR are to be optimized at cutoff frequency of 12 Gz.

<A Second Preferred Embodiment: A Microwave SMA Connector Using Multi-Step Structure with Broad Bandwidth Response Characteristics>

A microwave SMA connector with improved broad bandwidth response characteristics is described with reference to the attached FIG. 4 illustrating another preferred embodiment of this invention. In the embodiment multi step transition parts are formed differently from a first embodiment. In FIG. 4 the body has triple step transition parts and the central conductor has also triple step transition parts wherein the central conductor corresponds to the body. In this embodiment it is characterized in that the taper size of this embodiment is smaller than a first embodiment's one. We do not explain about the same part as a first embodiment.

In accordance with the present invention, the characteristic impedance of a microwave SMA connector with improved broad bandwidth response characteristics, is also obtained by the ratio of the thickness of central conductor i.e. central signal line to the thickness of insulator. Therefore it is preferable that the characteristic impedance of the connector manufactured by this invention is to be 50Ω. And it is preferable that the insulator is Teflon; the body and the central conductor are to be gilded with gold in order to optimize the RF characteristics according to a conductor.

The two bodies of the connector designed according to the invention plays a role as ground from the RF characteristics point of view. In addition, a taper fixes dielectric substance i.e. insulator to a central conductor and its length has to satisfy equation 1.

The step transition part is used in order to improve RF characteristics. And it is preferable that the characteristic impedance is designed to be 50Ω and the distance between step transition part of the body and step transition part of the central conductor has to satisfy equation 2.

An environment of FIG. 4 according to the present invention can get extraordinarily improved RF characteristics compared to the existing structures by adjusting the length of each step and optimizing it according to the high frequency in order to get characteristic impedance matching and excellent microwave response characteristics. In designing this connector many tools can be used, but in this embodiment, HFSS 5.6 that is 3D simulation program of Agilent Company can be used because this simulator is simulation tool to use FEM (finite element method) and although it takes longer time compared to other programs, it is very accurate for passive elements. FIG. 5 shows the simulation results performed about the connector of FIG. 4 by using the above software. FIG. 5 shows the characteristics that inserted loss of the connector is about above −0.24 dB 1 up to 18 GHz and VSWR is maintained in the rate of about 1.03: 1 up to 18 GHz.

In the microwave bandwidth the response characteristic is apt to be changed at a little bit of change. Therefore in development of a microwave connector having broad bandwidth response characteristics the RF characteristics is not improved by simply inserting a step but by a design technology to optimize a system.

Accordingly it is preferable that the SMA connector according to the invention is designed so that its characteristic impedance, the inserted loss and the VSWR are to be optimized at cutoff frequency of 18 GHz.

<A Third Preferred Embodiment: A Microwave SMA Connector Using Slot and Step Structure with Broad Bandwidth>

A microwave SMA connector with broad bandwidth response characteristics whose RF characteristics was improved is explained with reference to the attached FIG. 6.

In accordance with the present invention, the characteristic impedance of a connector whose RF characteristics was improved is obtained by the ratio of the thickness of central conductor i.e. central signal line to the thickness of insulator. Therefore it is preferable that the characteristic impedance of the connector according to this embodiment is 50Ω and its insulator is Teflon and the body and the central conductor are gilded with gold in order to optimize the RF characteristics according to conductor.

The two bodies of the connector designed by this invention play role as ground according to the RF characteristics. In addition, it is preferable that a taper fixes an insulator i.e. dielectric substance to a central conductor and its length satisfies the above equation 1.

A step transition part is used in order to improve RF characteristics and it is preferable that characteristic impedance is designed to be 50Ω and the distance between step transition part of the body and step transition part of the central conductor has to satisfy equation 2.

As shown in FIG. 6, the connector of this embodiment comprises multi-step having above two steps and a slot to use the differential change of impedance and the extraordinarily improved RF characteristics compared to the connectors having existing structure of this connector appears by optimizing step and slot according to the high frequency.

It is characterized in that the step transition parts of the body and the central conductor have multi-step structure and slot is formed at the left of taper. And the distance between taper and the step transition part in the central conductor is farther than in other embodiments.

FIG. 7 shows that the inserted loss of the connector is about above −0.25 dB and the VSWR is maintained in the rate of about 1.03: 1 up to 18 GHz. Its performance is the best of the world in this field.

In the microwave bandwidth the response characteristics is apt to be changed at a little bit of change. Therefore in development of a microwave connector having broad bandwidth response characteristics the RF characteristics is not improved by simply inserting a step and a slot but by the optimization of each step and slot.

It is preferable that an SMA connector is designed so that its characteristic impedance, the insertion loss and the VSWR are to be optimized at cutoff frequency of 18 GHz.

<A Fourth Preferred Embodiment 4: A Microwave SMA Connector with Inserted Slit in Conductor>

Hereinafter the Ku-band microwave SMA connector according to the present invention is described with reference to FIG. 8.

The characteristic impedance of the Ku-band microwave SMA connector according to the present invention is obtained by the ratio of the thickness of central conductor i.e. central signal line to the thickness of insulator. And it is preferable that the component equipments are designed to have impedance of 50Ω, where their power transmission and power loss are the least. And it is preferable that the SMA type connector used in each RF component has impedance of 50Ω fixedly for impedance matching too. Accordingly it is preferable that the characteristic impedance is designed as 50Ω, an insulator is Teflon whose dielectric coefficient is 2.08, a body and a central conductor are gilded with gold to maximize the RF characteristics according to the conductor.

In FIG. 8, it is characterized in that the step transition part of the central conductor has a unit step structure (it is possible to use multi-step structure) and a slot is formed but there is no taper differently from other embodiments.

The body of the connector according to this invention plays a role as ground from the RF characteristics point of view. The slit inserted in a conductor fixes a dielectric substance and the central conductor and improves the inserted loss and the characteristics of VSWR In addition, the thickness, the depth and the length of the slit should keep the constant value. The step transition part is used in order to improve RF characteristics.

It is preferable that the characteristic impedance is 50Ω and the distance between the step transition part of the body and the step transition part of the central conductor keeps constant length.

It is preferable that the cutoff frequency of the SMA connector according to the present invention is 18 GHz and the characteristic impedance, the inserted loss and the VSWR are to be optimized at the cutoff frequency. Of the connector in this embodiment, FIG. 9 shows inserted loss and reflected loss of a connector of the embodiment and FIG. 10 shows VSWR of the embodiment.

<A Fifth Preferred Embodiment: A Microwave SMA Connector with Inserted Air Between Central and Outside Conductors>

Hereinafter the K-band microwave SMA connector with inserted air according to the present invention is described with reference to FIG. 11.

The characteristic impedance of the K-band microwave SMA connector in accordance with the present invention is obtained by the ratio of the thickness of central conductor i.e. central signal line to the thickness of insulator. It is preferable that the component equipments of RF field are designed to have 50Ω impedance where the power transmission and power loss is the least. And it is preferable that the characteristic impedance of the connector manufactured according to the present invention is 50Ω and the insulator is Teflon (dielectric coefficient is 2.08), and the body and the central conductor are gilded with gold in order to optimize the RF characteristics according to the conductor. And at the place where air layer (dielectric coefficient 1) is inserted between two dielectric substances and Teflon, it is preferable that a diameter of central conductor changes according to the impedance matching and its characteristic impedance is set to 50Ω.

In FIG. 11, it is characterized in that the step transition part has a unit step structure (it is possible to use multi-step structure), but it has no taper and air layer is inserted between two dielectric substances and the step transition part contacts with the air layer.

The body of the connector manufactured by this invention plays a role as ground from the RF characteristics point of view. The air layer inserted between two dielectric substances fixes a dielectric, central conductor and outer conductor by means of diameter according to the air layer of the central conductor and improves inserted loss and characteristic of VSWR and the fix is made by a diameter according to the air layer part of the central conductor. And the step transition part is used in order to improve RF characteristics. It is preferable that characteristic impedance is 50Ω and the distance between step transition part of the body and step transition part of the central conductor is fixed to be constant.

It is preferable that the SMA connector according to the present invention is designed so that its characteristic impedance, the insertion loss and the VSWR are to be optimized at cutoff frequency of 26.5 GHz.

FIG. 12 shows the graph of inserted loss and reflected loss of a connector according to the present invention and FIG. 13 shows the graph of VSWR of a connector according to the present invention.

The present invention may be modified and embodied in various forms, and it has been described and illustrated herein with reference to a specific embodiment thereof. However, it should be understood that this invention is not limited to the particular form as described above, and that this invention includes all modifications, equivalents and substitutes within the spirits and scope of this invention as defined in the "claims" attached here to.

It is the expected effects of the present invention:

First, in this invention, the production is simple and the production cost is low because bar type outer conductor and bar type dielectric substance of the existing connector are used. And it can minimize the RF loss caused to using the barb captured contact method owing to the step structure of outer conductor and dielectric substance and the dielectric captured contact method using taper.

Second, in this invention, the RF loss caused by using a barb captured contact method through a dielectric captured contact method using inserted slit and the step structure of outer conductor and dielectric substance, can be minimized.

Third, in this invention, the RF loss caused by the barb captured contact method using structure of outer conductor and dielectric substance and air layer inserted between two dielectric substances can be minimized.

What is claimed is:

1. A microwave SMA connector comprising:

a body acting as ground;

a central conductor existing in the inner part of said body;

an insulator with a predetermined dielectric constant existing between said body and said central conductor;

a first step transition part formed in said body;

a taper formed in said central conductor in order to fix said central conductor and said insulator and to improve RF characteristics; and a second step transition part formed in said central conductor corresponding to said first step transition part to improve RF characteristics.

2. A microwave SMA connector as set forth in claim 1, wherein the length ι of said taper is determined by the relation of $$l \leq \frac{\lambda_g}{4},$$

where $\lambda_g$ is wavelength of the highest one of frequencies that can pass the conductor.

3. A microwave SMA connector as set forth in claim 2, wherein the distance h between said first step transition part and said second step transition part is determined by the relation of $$h \leq \frac{\lambda_g}{10}.$$

4. A microwave SMA connector as set forth in claim 1, wherein said insulator is Teflon.

5. A microwave SMA connector as set forth in claim 1, wherein said body and said central conductor are gilded with gold.

6. Microwave SMA connector as set forth in claim 1, wherein the characteristic impedance of said step transition part is 50Ω.

7. A microwave SMA connector as set forth in claim 6, wherein the cutoff frequency of said connector is set to have up to 12 GHz bandwidths so that said connector has low loss.

8. A microwave SMA connector as set forth in claim 7, wherein the characteristic impedance, the insertion loss and the VSWR of said connector are optimized at said cutoff frequency.

9. A microwave SMA connector with broad bandwidth characteristics comprising:

a body acting as ground;

a central conductor existing in the inner part of said body;

an insulator with a predetermined dielectric constant existing between said body and said central conductor;

a first step transition part having multi-step structure in said body;

a taper formed in said central conductor to fix said central conductor at said insulator and to improve RE characteristics; and a second step transition part having multi-step structure formed in said central conductor corresponding to said first step transition part to improve RF characteristics.

10. A microwave SMA connector with broad bandwidth characteristics as set forth in claim 9, wherein said insulator is Teflon.

11. A microwave SMA connector with broad bandwidth characteristics as set forth in claim 9, wherein said body and said central conductor are gilded with gold.

12. A microwave SMA connector with broad bandwidth characteristics as set forth in claim 9,the characteristic impedance of said step transition part is 50Ω.

13. A microwave SMA connector with broad bandwidth characteristics as set forth in claim 12, wherein the cutoff frequency of said connector is set to have up to 18 GHz bandwidths so that said connector has low loss.

14. A microwave SMA connector with broad bandwidth characteristics as set forth in claim 13, wherein the characteristic impedance, the insertion loss and the VSWR of said connector are optimized at said cutoff frequency.

15. A microwave SMA connector with broad bandwidth characteristics as set forth in claim 9, wherein the length ι of said taper is determined by the relation of $$l \leq \frac{\lambda_g}{4},$$

where $\lambda_g$is wavelength of the highest one of frequencies that can pass the conductor.

16. A microwave SMA connector with broad bandwidth characteristics as set forth in claim 15, wherein the distance h between said first step transition part and said second step transition part is determined by the relation of $$h \leq \frac{\lambda_g}{10}.$$

17. A microwave SMA connector with broad bandwidth characteristics as set forth in claim 15, the characteristic impedance of said step transition part is 50Ω.

18. A microwave SMA connector with broad bandwidth characteristics comprising:

a body acting as ground;

a central conductor existing in the inner part of said body;

an insulator with a predetermined dielectric constant existing between said body and said central conductor;

a first step transition part having multi-step structure in said body;

- a taper formed in said central conductor to fix said central conductor at said insulator and to improve RF characteristics;
- a second step transition part having multi-step structure formed in said central conductor corresponding to said first step transition part to improve RF characteristics; and
- a slot formed in said central conductor.

19. A microwave SMA connector with broad bandwidth characteristics as set forth in claim 18, wherein said insulator is Teflon.

20. A microwave SMA connector with broad bandwidth characteristics as set forth in claim 18, wherein said body and said central conductor are gilded with gold.

21. A microwave SMA connector with broad bandwidth characteristics as set forth in claim 18, the characteristic impedance of said step transition part is 50 Ω.

22. A microwave SMA connector with broad bandwidth characteristics as set forth in claim 21, wherein the cutoff frequency of said connector is set to have up to 18 GHz bandwidths so that said connector has low loss.

23. A microwave SMA connector with broad bandwidth characteristics as set forth in claim 22, wherein the characteristic impedance, the insertion loss and the VSWR of said connector are optimized at said cutoff frequency.

24. A microwave SMA connector with broad bandwidth characteristics as set forth in claim 18, wherein the length ι of said taper is determined by the relation of $$l \le \frac{\lambda_g}{4},$$

where $\lambda_g$ is wavelength of the highest one of frequencies that can pass the conductor.

25. A microwave SMA connector with broad bandwidth characteristics as set forth in claim 24, wherein the distance h between said first step transition part and said second step transition part is determined by the relation of $$h \le \frac{\lambda_g}{10}.$$

26. A microwave SMA connector with broad bandwidth characteristics as set forth in claim 24, the characteristic impedance of said step transition part is 50Ω.

* * * * *